United States Patent
Giefers

(10) Patent No.: US 7,931,488 B2
(45) Date of Patent: *Apr. 26, 2011

(54) CONNECTION AND JUNCTION BOX FOR A SOLAR MODULE

(75) Inventor: Stefan Giefers, Detmold (DE)

(73) Assignee: Phoenix Contact GmbH & Co. KG (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/525,775

(22) PCT Filed: Apr. 2, 2008

(86) PCT No.: PCT/EP2008/000857
§ 371 (c)(1),
(2), (4) Date: Jan. 8, 2010

(87) PCT Pub. No.: WO2008/095668
PCT Pub. Date: Aug. 14, 2008

(65) Prior Publication Data
US 2010/0112851 A1    May 6, 2010

(30) Foreign Application Priority Data

Feb. 5, 2007 (DE) .......................... 10 2007 006 433
Aug. 7, 2007 (DE) .......................... 10 2007 037 130

(51) Int. Cl.
*H01R 4/24* (2006.01)
(52) U.S. Cl. ...................................................... 439/441
(58) Field of Classification Search .................. 439/441, 439/535, 709, 835; 174/59
See application file for complete search history.

(56) References Cited

U.S. PATENT DOCUMENTS

| 4,460,232 | A * | 7/1984 | Sotolongo ..................... 439/535 |
| 6,344,612 | B1 * | 2/2002 | Kuwahara et al. .............. 174/50 |
| 7,097,516 | B2 * | 8/2006 | Werner et al. ................. 439/709 |
| 7,618,265 | B2 * | 11/2009 | Rueggen et al. ............. 439/76.1 |
| 7,648,371 | B2 * | 1/2010 | Boensch et al. ............. 439/76.1 |
| 7,824,190 | B2 * | 11/2010 | Beck et al. ................... 439/76.1 |
| 2006/0049802 | A1 | 3/2006 | Higashikozono et al. |
| 2009/0272559 | A1 * | 11/2009 | Richter et al. .................. 174/59 |

FOREIGN PATENT DOCUMENTS

| DE | 10 2004 020 958 | 8/2005 |
| DE | 10 2004 020958 | 8/2005 |
| DE | 102004020958 B3 | 8/2005 |
| DE | 103 58 140 | 9/2005 |
| DE | 20 2005 018884 | 2/2006 |
| DE | 202005018884 U1 | 2/2006 |
| DE | 20 2005 018 884 | 3/2006 |
| DE | 10 2005 025 632 | 12/2006 |
| EP | 1102 354 | 3/2001 |
| EP | 1102354 A2 | 5/2001 |
| EP | 1672 702 | 6/2006 |
| EP | 1672702 A1 | 6/2006 |
| WO | WO 2007/118798 | 10/2007 |

* cited by examiner

*Primary Examiner* — Phuong K Dinh
(74) *Attorney, Agent, or Firm* — Reising Ethington PC

(57) ABSTRACT

A connection and junction box for a photovoltaic solar module having flexible flat conductor band protruding from the surface of the solar module, wherein the connection and junction box has an insertion mouth at its side facing the solar module in mounted state, for at least one flexible flat conductor band of the solar module, and comprises a housing for attaching on the solar module, and a connection device for the flexible flat conductor band, positioned in the housing, the connection device has an electrical contact clamp, which is closed when putting the box on the solar module, and thereby catches and contacts the flat conductor band.

17 Claims, 5 Drawing Sheets

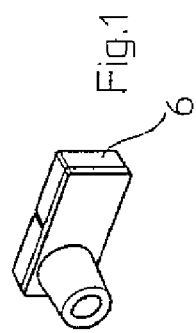
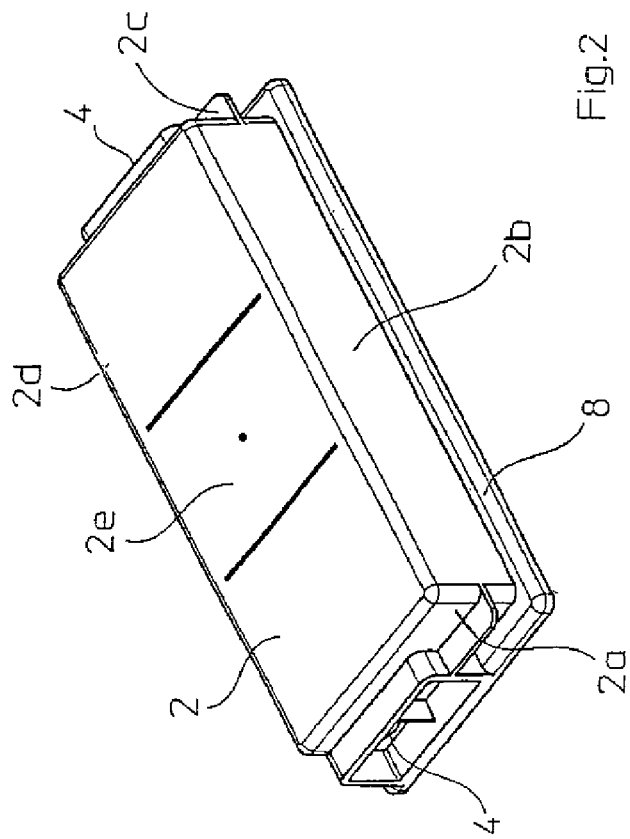
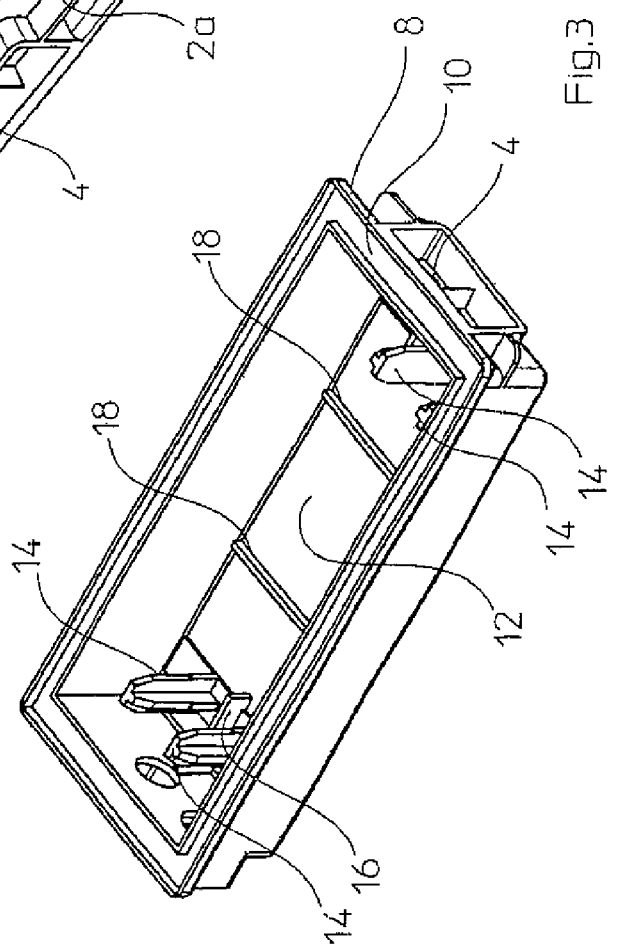

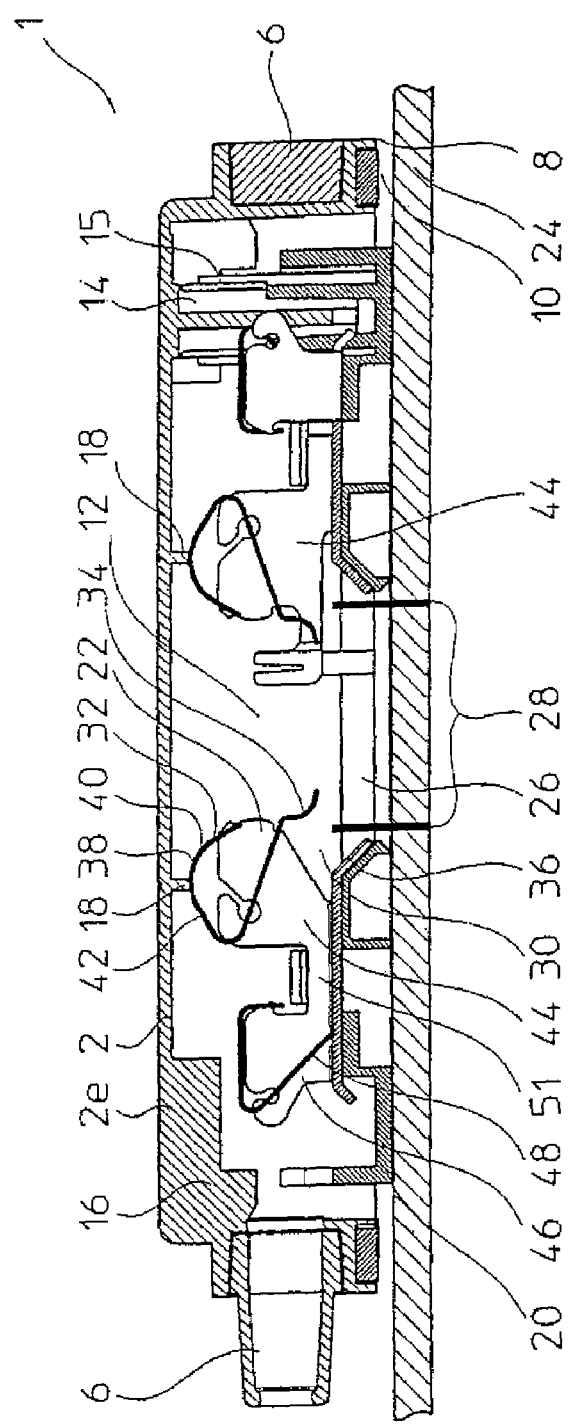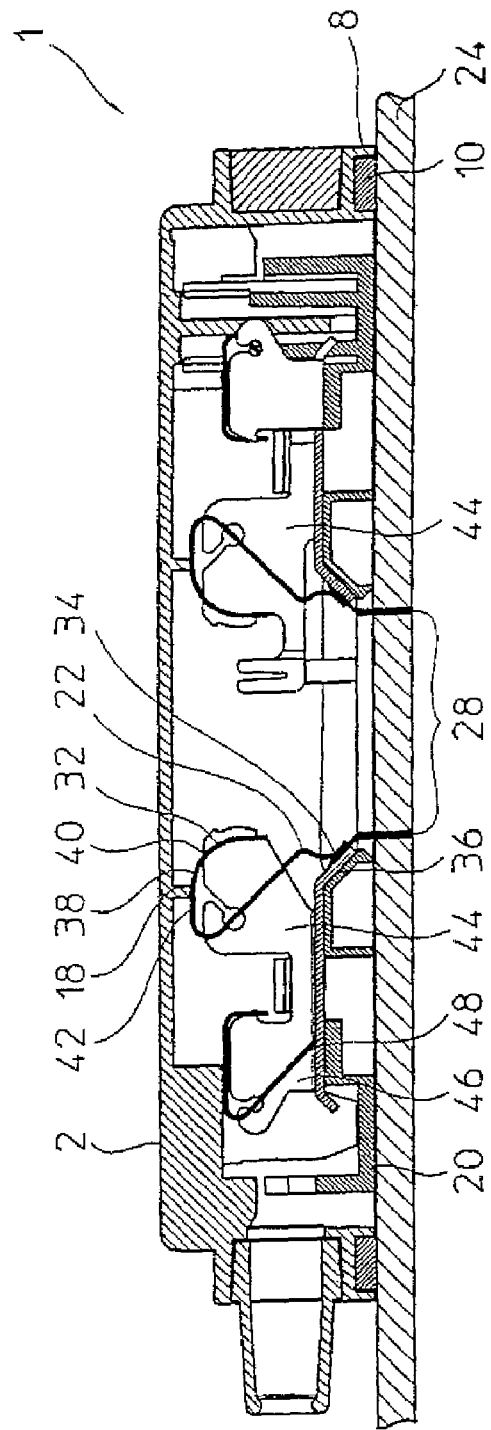

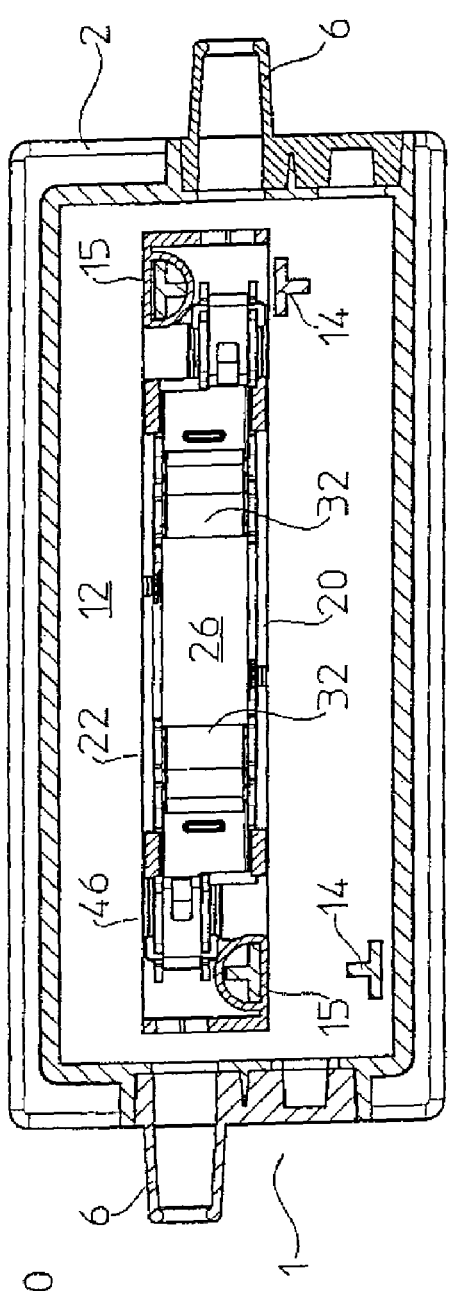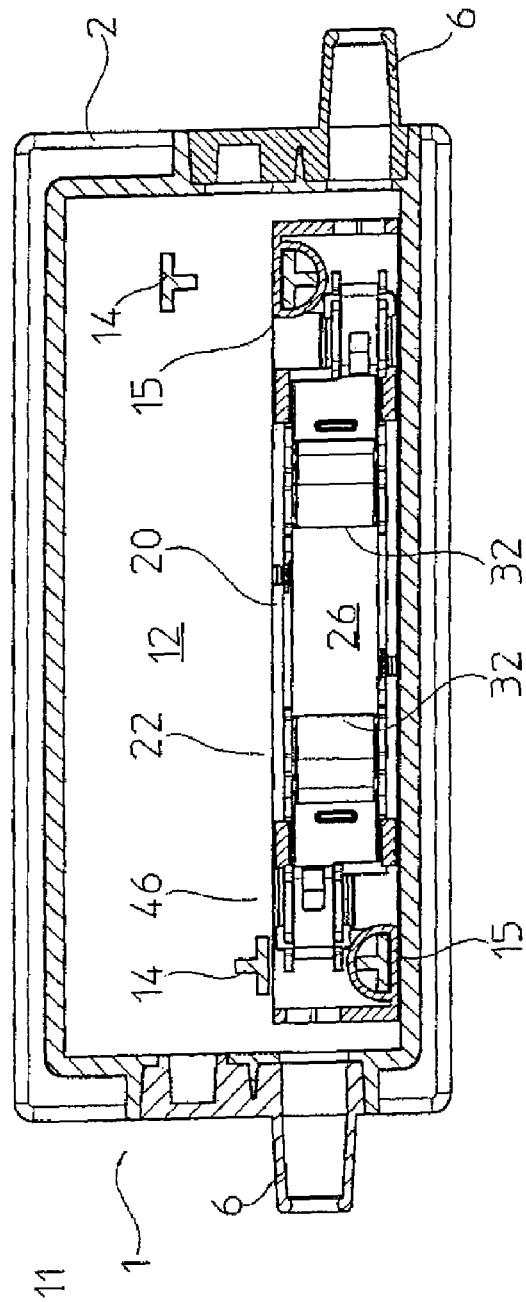

CONNECTION AND JUNCTION BOX FOR A SOLAR MODULE

FIELD OF THE INVENTION

The invention relates to a connection and junction box for a photovoltaic solar module having flexible flat conductor bands protruding from the surface of the solar module, as well as to a connection device for the connection and junction box.

BACKGROUND OF THE INVENTION

Over the past years, producing photovoltaic solar modules has literally been booming, inter alia due to the increased demand on environmentally sound energy production. The direct conversion of sunlight into electric current by means of photovoltaic solar modules is entirely emission-free, and no risks for humans and the environment are almost involved. For example, complete roofs of new buildings are therefore recently overlaid with solar modules, and even "solar power plants" are built. Due to the technical development of photovoltaics, using solar modules more and more becomes efficient even in more unfavourable latitudes such as Middle Europe and Northern America so that especially in these regions there is a great demand. Due to the continuous progress of the efficiency of solar modules due to technical further development on the one hand as well as increasing costs of energy production with other energy carriers as fossil fuels or nuclear energy, photovoltaic power generation becomes more and more competitive.

It is apparent that the success of solar modules in economic competition with other energy carriers depends on the costs of producing and mounting the solar modules.

Typically, solar modules consist of a plurality of solar cells based on semiconductor technique, which cells are interconnected to large-scale solar panels. A typical solar module typically has a glass plate on its side facing the sun, and a transparent plastics layer on the rear side, in which layer the solar cells are embedded. Typically, the rear side of the solar module is covered with a weather-resistant plastics compound foil, for example polyvinyl fluoride and polyester. The mono- or polycrystalline solar cells are electrically interconnected to each other by means of small solder wires. Typically, the solar module is furthermore mounted in a metal profile frame for fixing and stiffening the compound. Therefore, a solar module basically is a two-dimensional entity, similar to a glass plate.

Typically, solar modules have thin flexible conductor bands on the side facing away from the sun. These bands are mostly made of copper and vertically protrude from the rear side of the solar module. These flexible conductor bands are very sensitive and therefore difficult to contact. Additionally, a mechanical charge for fixing an electrical connector is also difficult because of the disk-like form of the solar module. Therefore, a special kind of electrical connectors has evolved for such solar modules, which kind is called connection box or connection and junction box. Typically, the connection and junction box is glued on the rearward surface of the solar module, and has electrical connection devices inside for contacting the flexible flat conductor bands of the solar module. Furthermore, if needed, the connection and junction box has an apparatus for connecting an electrical connection cable, which is connected with the flexible flat conductor band of the solar module by means of the connection and junction box for conducting the electrical current generated by the solar module.

Furthermore, several solar modules are typically operated in series connection, wherein a so-called bypass diode or free-wheeling diode is anti-parallel connected to each module. Inside the connection and junction box, the free-wheeling diode is connected to the electrical connection device. If a module is shaded or does not produce electricity because of a defect, this module would lower the power of the solar modules in series connection or even suffers damage without bypass diode. This is avoided by the bypass diode, because the current flows through the diode and is sustained.

It is apparent that due to the mechanical conditions, particularly the form of the solar module and the sensitiveness of the flexible flat conductor bands, a number of difficulties occur, when constructing the connection and junction box. Up to now, connection boxes are known, which are put over the flexible flat conductor bands. When doing so, the flexible flat conductor band is manually bent and contacted by means of a contact clamp or a soldered connection. The connection box is closed in a further process step. It is apparent that mounting such connection devices or connection boxes respectively is laborious, and is badly suited for automated mass production.

An electrical connection and junction box for a solar module is known from DE 103 58 140 B4, which box has a guiding arrangement at its lower side. The thin conductor band is guided in this guiding arrangement in lateral direction with low slackness in order to avoid buckling or folding the conductor bands, when inserting into the clamp apparatus. At this, it is disadvantageous that the conductor band has to be threaded into the narrow guiding arrangement, and the clamping force of the clamp arrangement may nevertheless be relatively low to be able to insert the thin conductor band into the clamp arrangement.

After all this, there is need for improvements in this regard, due to the high pressure to innovate in producing solar modules.

SUMMARY OF THE INVENTION

Therefore, it is an object of the present invention to provide a connection and junction box for a photovoltaic solar module, which box may automatically, e.g. by means of a robot, be connected to the solar module, and offers high contact reliability and long-life cycle.

It is a further object of the invention to provide such a connection and junction box, which has a kind of tolerance concerning the lateral positioning on the solar module.

It is a further object of the invention to provide such a connection and junction box, which avoids, or at least lowers the disadvantages of the state of the art, and may cost-effectively be produced as well as be mounted.

According to the invention, a connection and junction box for a solar module with flexible flat conductor bands protruding from the surface of the solar module is provided. At its side facing the solar module in mounting state, the connection and junction box has an insertion mouth for at least one flexible flat conductor band of the solar module as well as a housing for attaching to the solar module. In the housing there is a connection device for the flexible flat conductor band.

The connection device has a first electrical contacting arrangement with an electrical contact clamp, which may be in at least two defined stable states, namely an open mounting state, and a closed contacting state. In the open mounting state, the flat conductor band is resistance-less insertable into the connection device, in fact into a free catch area of the contact clamp. In the closed contacting state, the flat conductor band is electrically contacted in the contact clamp, and is clamped with a predefined clamping force.

Furthermore, the connection and junction box has an actuation element for actuating the contact clamp so that the contact clamp is automatically closed in response to the actuation, and thus the electrical contact with the flat conductor band is established. The actuation or the transition from the mounting state into the contacting state is preferably carried out automatically, when the connection and junction box is put on the by pushing the housing against the solar module perpendicularly to the surface of the solar module.

Preferably, the contact clamp has a clamp spring and a counter clamp element, of which at least one of the two has an electrical contacting section, and wherein the electrical contact with the flat conductor band is closed by an active movement of the clamp spring or of the counter clamp element in response to the actuation by means of the actuation element. For this, it is easy to implement to pivotably mount the clamp spring at the connection device, and to close the electrical contact with the flat conductor band by means of pivoting the clamp spring in response to the actuation by means of the actuation element. At this, a clamp section of the clamp spring passes over the catch area between the clamp spring and the counter clamp element for grasping the flat conductor band. Thus, the catch area preferably is relatively large and free of resistances or barriers when inserting the flat conductor band so that the danger of damaging the flat conductor band is avoided.

In a preferable manner, a high and predefined clamping and contacting force may be caused by actively closing the contact clamp after inserting the flat conductor band.

Preferably, the actuation element is attached to the housing, e.g. it is formed one-piece with the housing, and the housing is movable with respect to the connection device, preferably linearly slideable such that the contact clamp is automatically closed by means of moving the housing with respect to the connection device. For this, the connection and junction box has a sliding arrangement between the housing and the connection device so that when putting the connection and junction box on the solar module, the housing is slided with respect to the connection device, laterally to the surface of the solar module, whereby the actuation element automatically closes the contact clamp during the process of putting on for establishing the electrical contact with the flat conductor band. Purposefully, the sliding arrangement comprises a guide sleeve, e.g. at the connection device, and an alignment pin, e.g. at the housing. For securing the connection device against falling off in the housing when attaching the connection and junction box in the mounting state, the sliding arrangement is formed self-clamping, namely such that this clamping is superable by applying a force to the housing towards the solar module when putting the box on the solar for sliding the housing relatively to the connection device supporting itself against the solar module, till the housing engages the solar module.

This offers the advantage that in case of automatically mounting the box on the solar module, only one production step with a linear movement has to be carried out, which can particularly easily be carried out by a mounting robot.

According to a preferred embodiment of the invention, the leaf spring like clamp spring has an actuation section, with which the actuation element of the housing acts together for closing the contact clamp, wherein the actuation section has a curved and a substantially linear section of the clamp spring. It is herewith ensured by suitable forming the two sections in an easy manner that in the mounting state, the contact clamp is fixed in open position for keeping the contact clamp open and for keeping the catch area free.

A constant clamping and contacting force is hereby ensured so that the contacting is of permanent quality.

Preferably, the counter clamp element is angled with respect to the surface of the solar module, e.g. about approximately 45°, so that the flat conductor band is angled in the contacting state.

Purposefully, the contact clamp has a metallic and generally U-shaped holding frame, in which the clamp spring is pivotably mounted by means of bearing studs in bearing openings. The holding frame is slotted towards the bearing openings so that when pre-mounting the connection and junction box, the bearing studs of the clamp spring may be inserted through the slots. Preferably, the first contacting arrangement yet has a cable connecting clamp for connecting the connection cable, which clamp is mounted in the same holding frame. Preferably, the cable connection clamp has a second clamp spring for closing the electrical contact with the connection cable.

Further preferably, the contact clamp has a latching mechanism, by means of which the clamp spring is latched in the contacting state, e.g. by latching the latching noses of the clamp spring in the holding frame. In the closed and latched state, the contact clamp is under tension.

Preferably, the connection device has a dielectric carrier, which defines the lower insertion mouth for the flat conductor band, and in which the holding frame is latched by means of snap-fits on both sides.

According to an especially preferred embodiment of the invention, the connection device has two identical electrical contacting arrangements for simultaneously contacting two flat conductor bands by the housing having two actuation elements, which simultaneously close the contact clamps.

In the following, the invention is described in more detail on the basis of exemplary embodiments, and with reference to the figures, wherein same and similar elements are partially provided with the same reference numerals, and the features of the different embodiments may be combined with each other.

BRIEF DESCRIPTION OF THE DRAWINGS

It is shown

FIG. 1 a perspective view of a bend protection grommet for the connection cable, FIG. 2 a perspective view from above on the housing of the connection and junction box, FIG. 3 a perspective view from below onto and into the housing of the connection and junction box, FIG. 4 a cross section laterally to the solar module through the connection and junction box with the electrical connection device in the open mounting state, FIG. 5 a cross section laterally to the solar module through the connection and junction box with the electrical connection device in the closed contacting state, FIG. 6 a perspective view of the connection device, FIG. 7 a perspective view of the first electrical contacting arrangement, FIG. 8 a view of the contact clamp for the flexible conductor band, FIG. 9 a view of the clamp spring for the connection cable, FIG. 10 a cross section through the connection and junction box parallel to the solar module, and FIG. 11 a cross section of an alternate embodiment of the connection box parallel to the solar module.

DETAILED DESCRIPTION OF THE INVENTION

Figure 6:
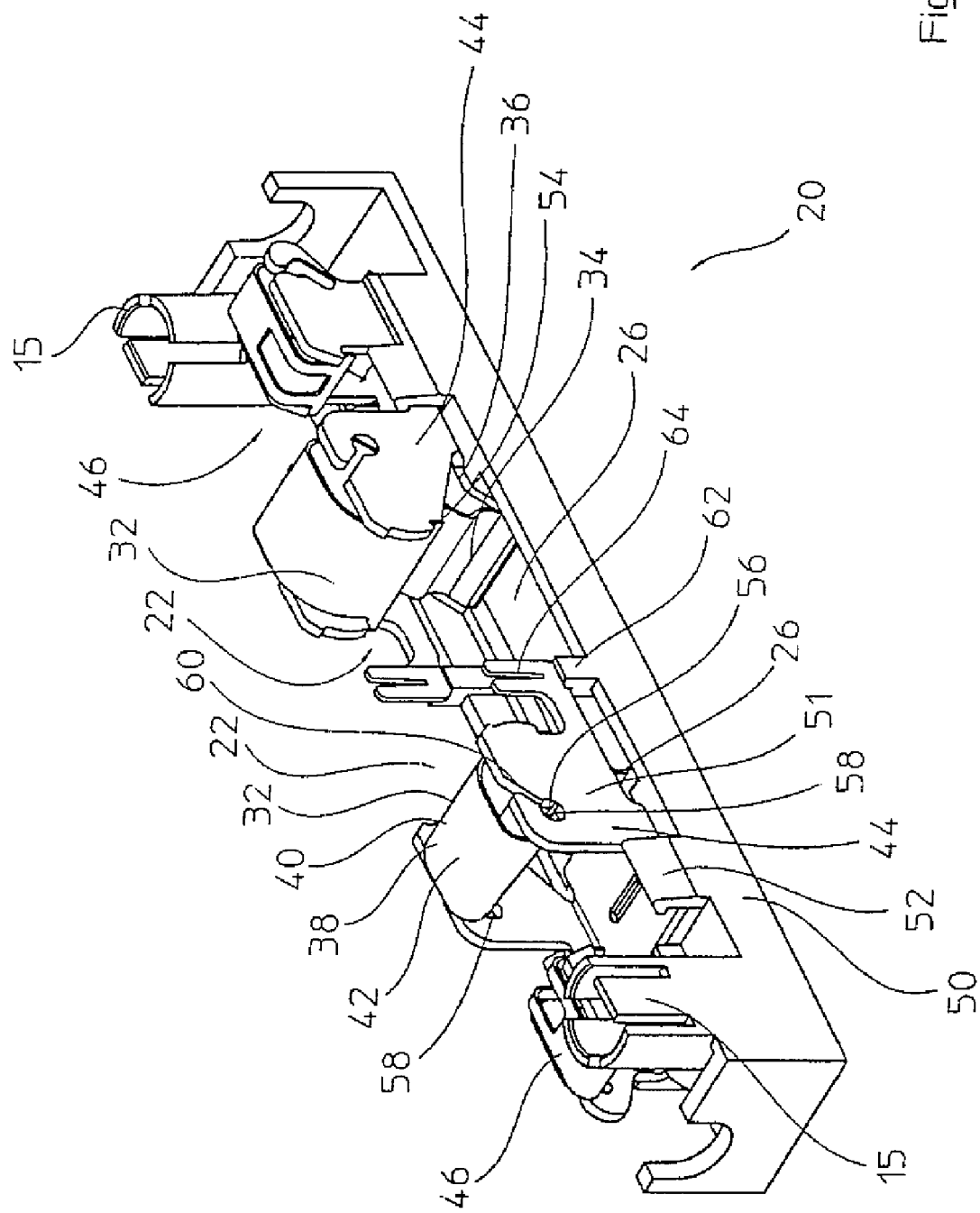
Figure 8:
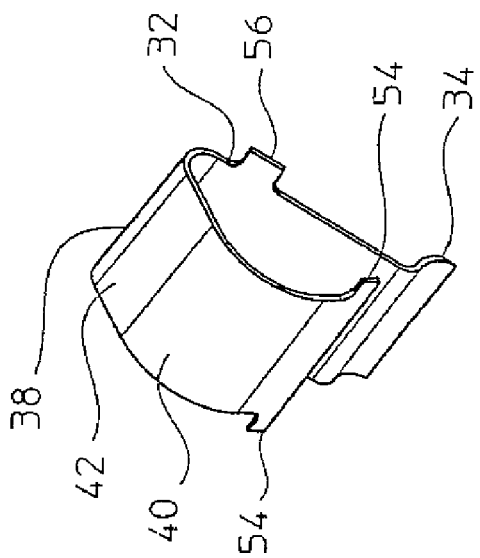
Figure 9:
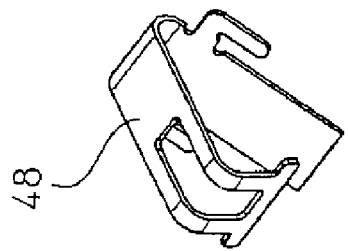
Figure 7:
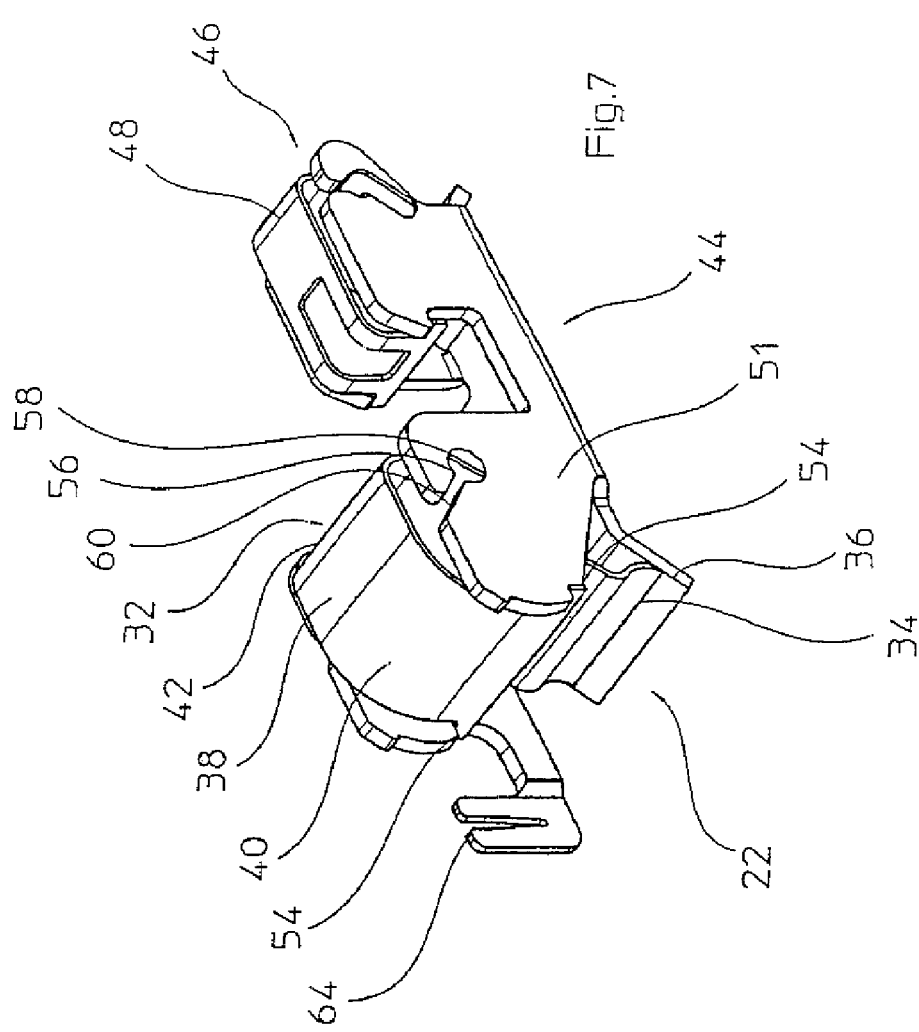

Referring to FIGS. 1-3, the connection and junction box has a housing 2 made of plastics. The housing 2 is formed by a substantially rectangular frame consisting of four side walls 2a to 2d, and a closed cap 2e connecting the four side walls and proceeding parallel to the solar module. The housing 2 being closed on five sides and being open downwards is die cast one-piece, for example. Separate bend protection grommets 6 are inserted each in connection cable lead-throughs.

Referring to FIG. 3, the housing 2 is open downwards, and has a protruding holding frame 8 with a circular glue notch 10 so that the housing 2 has a hat-like form. Finally, the connection and junction box is permanently fixed on the solar module by means of the glue placed in the glue notch 10. The hat-like or pan-like form of the housing defines an internal hollow space 12, in which the connection device not being shown in FIG. 3 is substantially waterproof housed in mounting state.

Alignment pins 14 protrude from the lower side of the housing cap 2e into the hollow space 12. A clamp bar 16 is provided at the inner side of the connection cable lead-throughs 4 between two alignment pins 14. Furthermore, the lower side of the housing cap 2e has two actuation devices 18. In this embodiment, the actuation devices, whose functionality will be described in more detail below, are made in the form of diagonally proceeding actuation bars, formed one-piece with the housing.

Referring to FIG. 4, the connection device 20 is positioned in the housing 2 of the connection and junction box 1. FIG. 4 shows the connection and junction box in the mounting state, in which the contact clamp 22 is open. The connection device 20 has guide sleeves 15, into which the alignment pins 14 are inserted. The alignment pins 14 clamp in the respective guide sleeves 15 such that when putting the connection and junction box 1 on the solar module 24, the connection device 20 is fixed in the housing 2 by clamping so that the housing may automatically put on by a robot without the connection device falling off. On the other hand, the clamping between the alignment pins 14 and the guide sleeves 15 may be overcome by applying a force for enabling a relative movement between the housing 2 and the connection device 20. In this example, the guide sleeve 15 is slotted for improving the superably clamping co-action with the alignment pin 14.

FIG. 4 shows the connection and junction box 1 in the open mounting state, in which the connection device 20 is not yet totally inserted into the housing 2. I.e. it protrudes a little downwards from the housing. In the mounting state, is there therefore is an offset between the lower side of the connection device 20 and the holding frame 8 of the housing 2 so that when attaching the connection and junction box 1, the connection device 20 firstly engages the solar module 24. In this state shown in FIG. 4, the holding frame 8 is still spaced apart from the surface of the solar module 24.

The connection and junction box 1 has a relatively large insertion opening 26 at its lower side facing the solar module 24. In the open mounting state, this ensures that the sensitive, flexible flat conductor band 28, the so-called "ribbon", is barrier-free and resistance-less inserted from below into the connection and junction box 20. The danger of damaging the flat conductor band 28 is hereby reduced. In this state, the contact clamp 22 defines an open catch area 30, into which the flat conductor band 28 resistance-less immerges from below, when putting on the connection and junction box. Preferably, the contact clamp 22 or the deflection arm 21 do still not touch the flat conductor band 28, in this state so that inserting and contacting the flat conductor band 29 takes place in two consecutive steps.

Now a force is applied to the housing 2 against the solar module 24 for closing the contact clamp, wherein the connection device 20 supports itself at the solar module 24. Hereby, a linear movement of the housing 2 with respect to the connection device 20 is caused to that effect that the housing 2 is slided over the connection device 20 till the holding frame 8 with the glue notch 10 engages the surface of the solar module 24, and till the lower side of the connection device 20 and of the housing 2 flushly abuts on the solar module 24. This state is shown in FIG. 5.

Referring to FIG. 5, the housing 2 is glued on the solar module by means of the glue being in the glue notch 10. During the relative movement of the housing against the connection device 20, the actuation element 18, in this example an actuation bar, further interacts with the clamp spring 32. Due to this actuation, the contact clamp 22 is closed by means of a pivoting of the clamp spring 31. Thereby, the clamp section 34 of the clamp spring 32 passes over the catch area 30, and catches the upper end of the flat conductor band 28 in order to electrically conductive clamp it between the clamp section 34 of the clamp spring 32 and the counter clamp element 36. When doing so, the flat conductor band 28 is angled, since the counter clamp element 36 is inclined about approximately 45° with respect to the solar module normal, in this example.

The clamp spring 32 has an actuation section 38, which is divided into a curved section 40, and a substantially linear section 42. During closing, the actuation element 18 firstly acts on the curved section 40 (see FIG. 4) and tensions against the linear section 42 in the closed contacting state of the connection and junction box 1, shown in FIG. 5. I.e. the actuation element 18 passes over the actuation section 38 of the clamp spring 32 during closing.

The contact clamp 22 is surrounded by a contacting arrangement 44 yet having a cable connection clamp for the electrical connection cable not being shown. In this example, the cable connection clamp 46 is also provided with a clamp spring 48. But also other connection variants such as screw clamps may be used here.

In the embodiment shown here, the connection device 20 comprises two identically formed and inversely arranged electrical contacting arrangements 44 for simultaneously contacting two flat conductor bands 28. But it is apparent that the connection concept according to the invention is not limited thereto, and that the connection device 20 may also comprise one or more than two electrical contacting arrangements 44.

Referring to FIG. 6, the connection device 20 has a dielectric carrier preferably made of plastics, which carrier defines primary joint surface to the solar module 54 and the insertion mouth in its lower side, and at which the contact arrangements 44 are mounted. The electrical arrangement 44 has a substantially U-shaped metallic holding frame 51, preferably made from copper, which is latched at the carrier 50 by means of snap-fits 52.

FIG. 6 shows the contact clamp 22 in the closed contacting state, in which the contact clamp 22 is latched. For this, the clamp spring 32 has two latching studs 54, which are latched in the metallic holding frame. In the latched state, the contact spring 32 is pretensioned against the counter clamp 36. This takes care of a permanent and safe electrical contact. The flat conductor band 18 is not shown in FIG. 6.

Furthermore, the clamp spring 32 is mounted in slotted bearing openings 58 by means of bearing studs 56. Therefore, the clamp spring 32 may easily be inserted, when mounting the connection and junction box, and is secured due to the position of the flat bearing stud 56, which position is rotated with respect to the slot 60 in the mounting state and in the contact state. The clamp spring 32 is punched from sheet steel, and substantially U-shaped curved.

The metallic holding frame 51 further has an electrical connection element 64 for the bypass-diode, which element is supported at the carrier 50 by means of a socket 62.

Due to the form of the two sections 40, 42 of the actuation section 38 of the clamp spring 32, the clamp spring 32 is fixed in the open mounting state such that the catch area 30 is kept open in the mounting state. By putting the connection and junction box 1 on the solar module, the conductor band 28 protruding from the solar module directly comes from below into this catch area 30.

Due to the interaction between the housing 2 and the connection device 20 by means of the actuation element 18, the clamp spring 32 is forced to leave the open position, and is caused to pivot.

The flat conductor band 28 being in the catch area 30 is grasped by the clamp section 34 and pushed against the counter clamp element 36 due to the persisting pivoting in an angle of 45° in this example. At the end of the pivoting, the clamp spring latches with its latch noses 54 into the metallic holding frame 51, in the contacting or operating state (FIG. 5). Due to the pretension of the clamp spring 32, a permanent and predefined pressing force is established between the flat conductor band 28 and the counter clamp element 36.

Referring to FIG. 10, an embodiment of the connection and junction box 1 is shown, in case of which the connection device is approximately laterally positioned in the mid of the housing for connecting flat conductor bands 28 being at the side.

But there are also solar modules, in case of which the flat conductor bands are at the side. The alternate embodiment of the invention shown in FIG. 11 serves for contacting these flat conductor bands 28, with which embodiment the connection device 20 is arranged at the lateral edge of the housing 2.

It is apparent to the person skilled in the art that the above described embodiments should be understood as examples, and that the invention is not limited to them, but can be varied in a variety of ways without leaving the scope of the invention. Furthermore, it is apparent that the features also individually define essential parts of the invention, even if they are commonly described together with other features, not depending, whether they are disclosed in the description, the figures, or otherwise.

The invention claimed is:

1. A connection and junction box (1) for a photovoltaic solar module (24) having flexible flat conductor bands (28) protruding from a surface of the solar module, wherein the connection and junction box (1) has an insertion mouth (26) at a side facing the solar module in mounted state, for at least one flexible flat conductor band (28) of the solar module (24), and comprises a housing (2) for attaching on the solar module (24), and a connection device for the flexible flat conductor band (28), positioned in the housing,
   wherein the connection device (20) has a first contacting device (44) with an electrical contact clamp (22), which defines an open mounting state, in which the flat conductor band (28) is insertable into the connection device (20) in a catch area (30) of the contact clamp (22), and which contact clamp (22) defines a closed contacting state, in which the flat conductor band is electrically contacted in the contact clamp (22), and
   wherein the connection and junction box (1) comprises an actuation element (18) for closing the contact clamp (22) for establishing an electrical contact with the flat conductor band (28).

2. The connection and junction box (1) according to claim 1, wherein the contact clamp (22) has a clamp spring (32) and a counter clamp element (36), and wherein the electrical contact with the flat conductor band (28) is closed by means of a movement of at least one of the clamp spring or the counter clamp element (36) in response to the actuation by means of the actuation element (18).

3. The connection and junction box (1) according to claim 2, wherein the clamp spring (32) and/or the counter clamp element (36) is pivotably mounted at the connection device (20), and the electrical contact with the flat conductor band (28) is closed by means of pivoting at least one of the clamp spring (32) or the counter clamp element (36) in response to the actuation by means of the actuation element (18).

4. The connection and junction box (1) according to claim 2, wherein a clamp section (34) of the clamp spring (32) or of the counter clamp element (36) passes over the catch area (30) when closing the contact clamp (22) for grasping the flat conductor band (28) and clamp contacting it afterwards.

5. The connection and junction box (1) according to claim 1, wherein the actuation element (18) is arranged at the housing, and the housing (2) is movable with respect to the connection device (20) such that due to moving the housing (2) with respect to the connection device (20), the contact clamp is automatically closed by means of the actuation element (28).

6. The connection and junction box (1) according to claim 5, wherein the housing (2) and the connection device (20) are slidable with respect to each other by means of a sliding arrangement (14, 15), and the housing (2) is slid with respect to the connection device (20), when putting the connection and junction box (1) on the solar module (24), whereby the actuation element (18) automatically closes the contact clamp (22) during the putting-on process for establishing the electrical contact (28).

7. The connection and junction box (1) according to claim 6, wherein the sliding arrangement (14, 15) comprises a guide sleeve (15) and an alignment pin (14), which clamp against each other in a mounting state such that on the one hand the connection device (20) in the housing (2) is secured against falling off, and on the other hand when mounting on the solar module, this clamping may be overcome by applying a force to the housing (2) against the solar module (24) for sliding the housing (2) relatively to the connection device (20) being held against the solar module (24) till the housing (2) engages the solar module (24).

8. The connection and junction box (1) according to claim 2, wherein the clamp spring (32) has an actuation section (38), with which the actuation element (18) of the housing (2) acts together for closing the contact clamp (22), and wherein the actuation section (38) comprises a curved section and a substantially linear section (40, 42) of the clamp spring (32).

9. The connection and junction box (1) according to claim 2, wherein the contact clamp (22) has a latching mechanism (54, 55), by means of which the clamp spring (32) is latched in the contacting state.

10. The connection and junction box (1) according to claim 2, wherein the contact clamp (22) is under tension in the closed and latched state for clamping and contacting the flat conductor band (28) between the clamp spring (32) and the counter clamp element (36) by means of a permanent clamping force.

11. The connection and junction box (1) according to claim 2, wherein the counter clamp element is arranged angular with respect to the surface of the solar module (24), and the flat conductor band (28) is angled in the contacted state.

12. The connection and junction box (1) according to claim 2, wherein the contact clamp (22) has a holding frame (51), and the clamp spring is pivotably mounted by means of bearing studs in bearing openings in the holding frame.

13. The connection and junction box (1) according to claim 12, wherein the holding frame is slotted towards the bearing openings for inserting the bearing studs (56) of the clamp spring (32) through the slots (60) when preassembling the connection and junction box, and for thus inserting the clamp spring (32) in the holding frame (51).

14. The connection and junction box (1) according to claim 12, wherein the holding frame (51) is made from electrically conductive material with a generally U-shaped configuration, and the first contacting device (44) has a cable connecting clamp (46) for connecting the connecting cable, wherein the cable connecting clamp (46) is mounted in the same holding frame (51) as the contact clamp (22) for the flat conductor band (28).

15. The connection and junction box (1) according to claim 12, wherein the connection device (20) has a dielectric carrier (50), in which the holding frame (51) is mounted.

16. The connection and junction box (1) according to claim 1, wherein the connection device (20) has a second contacting arrangement (44) being analogous to the first contacting arrangement (44), with a first contact clamp (22) for a second flat conductor band (28) of the solar module (24), and the housing (2) has a second actuation element (18), and when putting the connection and junction box on the solar module (24), the contact clamps (22) for the respective flexible flat conductor band (28) of the two contacting arrangements (44) are closed by means of the each assigned actuation element (18).

17. A connection device for the connection and junction box (1) according to one of the preceding claims, for a photovoltaic solar module (24) with flexible flat conductor bands (28) protruding from the surface of the solar module, comprising an insertion mouth for at least one of the flexible flat conductor bands of the solar module, and a contact clamp (22) for the flexible flat conductor band (28), wherein the contact clamp (22) defines an open mounting state, in which the flat conductor band (28) is insertable into a free catch area (30) of the contact clamp (22), and which clamp defines a closed contacting state, in which the flat conductor band (28) is electrically contacted in the contact clamp (22), and the contact clamp has a pivotable clamp spring (32) with actuation section (38) such that the contact clamp is automatically closed from a mounting state into the contacting state in response to actuating the clamp spring (32) at the actuation section (38) for fixedly clamping the afore inserted flat conductor band (28), and for establishing an electrical contact with the latter.

\* \* \* \* \*